United States Patent [19]

Tosswill

[11] Patent Number: 4,752,688

[45] Date of Patent: Jun. 21, 1988

[54] IMAGING TUBE

[75] Inventor: Christopher H. Tosswill, Sturbridge, Mass.

[73] Assignee: Galileo Electro-Optics Corp., Sturbridge, Mass.

[21] Appl. No.: 875,592

[22] Filed: Jun. 18, 1986

[51] Int. Cl.[4] ........................ G02F 1/01; H01L 25/00; G01T 1/22

[52] U.S. Cl. .................................... 250/330; 250/332; 250/370

[58] Field of Search .................... 250/330, 332, 370 R, 250/370 G, 370 H, 483.1

[56] References Cited

U.S. PATENT DOCUMENTS 3,845,296 10/1974 Schnitzler ........................ 250/370 G 4,119,852 10/1978 Rougeot .............................. 250/370

4,272,678 6/1981 Lange ................................. 250/483.1

4,311,906 1/1982 Felix et al. ....................... 250/370 G 4,338,627 7/1982 Stapleton ............................ 250/332

*Primary Examiner*—Janice A. Howell

[57] ABSTRACT

An imaging tube in which an image, particularly in middle infrared, is guided onto a mosaic of electrically separate semiconductor elements, and in which energy then applied to the mosaic produces electrons with characteristics reflecting whether the portion of the mosaic from which they emanated had been struck by energy defining the image, the electrons produced then being gated in accordance with the characteristics; and in particular in which the mosaic is carried on a substrate through which the image is introduced to the tube.

3 Claims, 1 Drawing Sheet

IMAGING TUBE

FIELD OF THE INVENTION

This invention relates to imaging tubes, particularly useful with inputs in the middle infrared range.

BACKGROUND OF THE INVENTION

Imaging tubes using transmissive photocathodes are well known in the art.

SUMMARY OF THE INVENTION

I have discovered that an imaging tube especially useful in imaging infrared light sources in the range of wavelengths of 5 to 15 microns may be had by providing a mosaic of electrically segregated semiconductor elements having electrical characteristics modified by impact thereon of the sources being imaged, along with means to provide from those areas thus modified, electrons in a corresponding pattern for amplification. In preferred embodiments, the electrons are generated by impact on the semiconductor elements of near infrared energy chosen so that only electrons emitted at semiconductor portions impacted by middle infrared will pass a screen interposed between the semiconductor elements and a channel electron multiplier, and the middle infrared rays impact on the semiconductor elements after passing through a middle infrared transmissive substrate, such as germanium, for the semiconductor array.

In a modified embodiment, channels of a microchannel plate are defined by optical fibers, with electron amplification and near infrared transmission moving in opposite directions through, respectively, the channels and the fibers.

DESCRIPTION OF THE PREFERRED EMBODIMENT

The preferred embodiment, shown in the drawing, has the structure and mode of operation now discussed.

DRAWINGS

STRUCTURE

Figure 2:
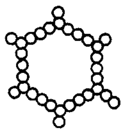
FIG. 2 is a vertical sectional view through one channel portion of the microchannel plate of a modified embodiment of the invention.
Figure 1:
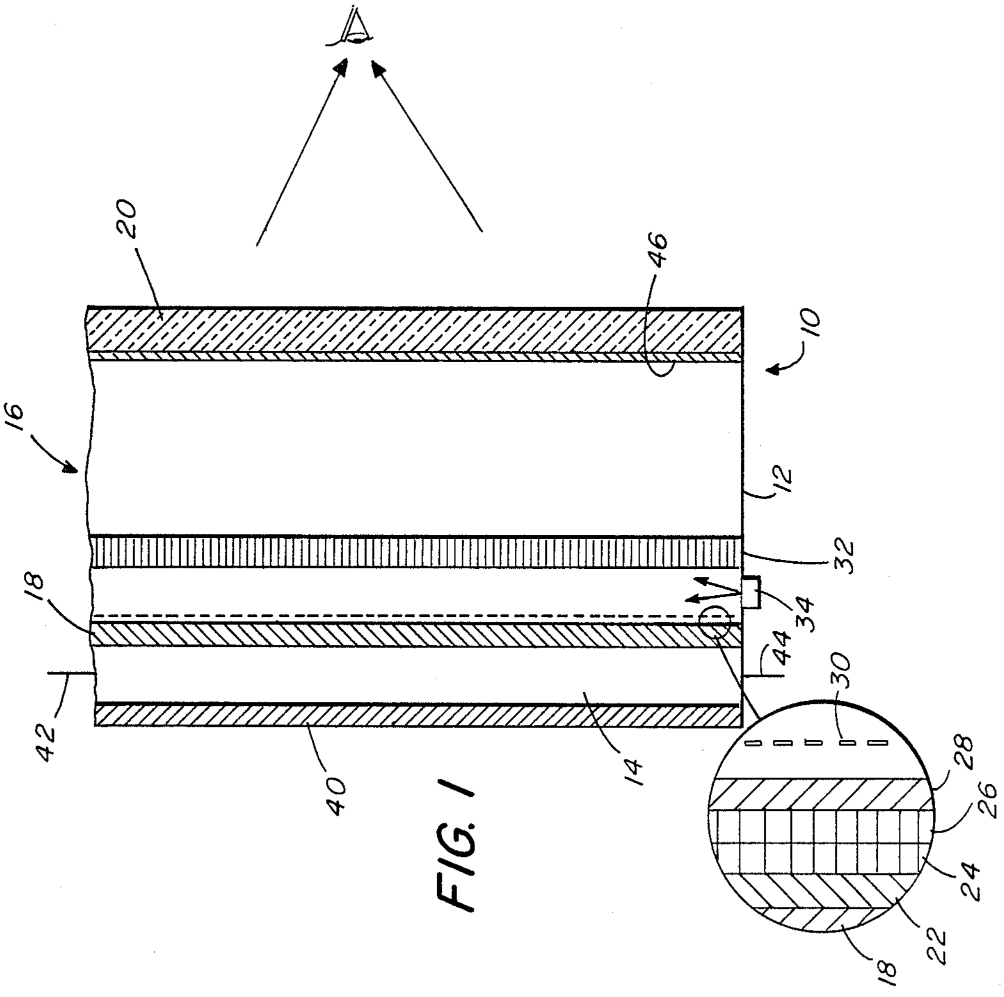
FIG. 1 is a vertical sectional view, somewhat diagrammatical, not to scale, and with a small portion shown enlarged, through the preferred embodiment.

There is shown in the drawing, indicated generally at 10, an imaging tube according to the invention.

The tube 10 includes a ceramic housing 12 surrounding a cryogenic portion 14 and a vacuum-tight imaging portion 16, the two being separated by germanium wall 18.

Window 20 transmissive to visible light is provided in housing 12 for viewing by eye.

Coated on wall 18 in imaging portion 16 is a continuous electrode 22 which carries on it a multiplicity of separate semiconductor phototransistor elements (indicated collectively at 24), as a mosaic. The elements 24 are about 75 microns square, and spaced apart with gaps of about 5 microns. Each semiconductor element carries on its face away from continuous electrode 22 an electrode 26 in contact only with its respective semiconductor element of the mosaic. Overlying the electrodes 26 is photocathode 28. Extending across portion 16 adjacent photocathode 28 is mesh grid 30. Mounted in portion 16 between wall 18 and microchannel plate 32 is LED photon emission source 34, of wavelength of 850 nanometers.

Germanium window 40 cooperates with germanium disc 18 and ceramic housing 12 (indicated diagrammatically, and extending from around window 40 along the entire length of the tube to surround window 20) to define a flow zone for helium at minus 180° C.; helium inlet and outlet conduits 42 and 44 are indicated diagrammatically.

Zone 16, extending from germanium disc 18 to phosphor layer 46 on window 20, is of course under vacuum.

Referring to FIG. 2, there is shown portion 47 of a microchannel plate in which channel walls 48 defining channels 50 of the multiplier are made of a plurality of optical fibers 52. Thus, this microchannel plate provides both electron amplification through channels 50 and transmission of near infrared through fibers 52.

OPERATION

In operation, middle infrared radiation, 10 microns in wavelength and defining an image, enters tube 10 through window 40 and substrate 18. Impact of rays of 10-micron infrared on particular semiconductor transistor elements 24 causes them to go to a negative 100 millivolt potential. At the same time, source 34 continuously supplies to photocathode 28 radiation at an emission wavelength of 850 nanometers; photocathode 28 has a photoemissive threshold of 900 nanometers, so that the radiation from source 34 causes photocathode 28 to emit photoelectrons at a kinetic energy of about 80 millivolts. The potential on mesh grid 30 is minus 125 millivolts, so that an electron at a potential energy of 80 millivolts is unable to go through it. However, where an area of photocathode 28 is in contact with an electrode element 26 which is in contact with a semiconductor element 24 which has been exposed to the middle infrared, that area of photocathode 28 has its potential reduced to minus 100 millivolts, making the voltage drop between it and grid 30 only 25 millivolts, enabling electrons from that area of photocathode 28 to penetrate the grid, in a patterning corresponding with the patterning of the IR beam incident on the tube.

Electrons thus leaving photocathode 28 enter microchannel plate 32, in which the signal is amplified, and whence it goes through a vacuum gap onto phosphor layer 46, coated surface of window 20, the phosphor converting the electrons to visible light, which is viewed through window 20.

OTHER EMBODIMENTS

The semiconductor elements in mosaic may be photoconductive, photovoltaic, or MIS elements. Alternatively, an electron beam may be used to produce a varying potential in the photocathode. The radiation to the photocathode to cause it to release electrons may be intermittent or continuous. In the embodiment presently most preferred, the ceramic housing 12 is replaced by ceramic insulating rings between short metal cylinders carrying the electrodes.

CLAIMS

Other embodiments are within the scope of the following claims:

I claim:

1. An imaging tube for imaging radiation comprising a mosaic of spaced semiconductor elements responsive to said radiation impact thereon with a change in electrical state, said semiconductor elements emitting electrons upon receiving photons, means to deliver a flow of photons onto said mosaic so as to emit said electrons, gating means for passage of electrons emitted from said semiconductor elements experiencing said radiation impact only, and channel electron multiplier means for amplification of gated electrons.

2. The imaging tube of claim 1 in which said mosaic is carried by a substrate, said substrate being transparent to said radiation.

3. The imaging tube of claim 2 in which said substrate is germanium.

* * * * *